United States Patent [19]

Dietz

[11] 4,238,712
[45] Dec. 9, 1980

[54] SWITCHED VERTICAL DEFLECTION WITH TRIAC

[75] Inventor: Wolfgang F. W. Dietz, New Hope, Pa.

[73] Assignee: RCA Corporation, New York, N.Y.

[21] Appl. No.: 41,095

[22] Filed: May 21, 1979

[51] Int. Cl.³ .............................................. H01J 29/72
[52] U.S. Cl. ..................................... 315/393; 315/408
[58] Field of Search ......................... 315/393, 408, 399

[56] References Cited
U.S. PATENT DOCUMENTS 4,174,493  11/1979  Dobbert et al. ..................... 315/408

*Primary Examiner*—Theodore M. Blum
*Attorney, Agent, or Firm*—Eugene M. Whitacre; Paul J. Rasmussen; Joseph J. Laks

[57] ABSTRACT

An SCR is one controllable switch thyristor in an SSVD circuit and the other is a triac. One electrode of each thyristor is grounded, and the gates of the thyristors are driven from the SSVD control circuit by pulse voltages relative to ground.

8 Claims, 3 Drawing Figures

4,238,712

SWITCHED VERTICAL DEFLECTION WITH TRIAC

BACKGROUND OF THE INVENTION

This invention relates to a synchronous switched vertical deflection (SSVD) circuit in which the control switches each have one element grounded and in which the control elements are driven relative to ground.

A television SSVD circuit is described in U.S. Pat. No. 4,048,544 issued Sept. 13, 1977 in the name of P. Haferl. The SSVD arrangement produces vertical deflection by the use of controlled switches, which gate horizontal-frequency energy from the television horizontal deflection generator to a vertical deflection winding. The horizontal-frequency energy coupled to the vertical deflection winding is integrated to produce current in the vertical deflection winding. The switches are controlled so as to vary the amount of energy coupled from the horizontal deflection circuit to the vertical deflection winding, thereby establishing the desired vertical deflection current amplitude-time signal shape. The SSVD arrangement as described in the aforementioned Haferl patent includes first and second windings coupled to the horizontal deflection generator which produce horizontal frequency signals having mutually opposite polarities relative to a reference potential (ground). A switch in the form of an SCR type thyristor is coupled in series with each of the windings for pulse-width modulation control of the energy coupled from each source winding to the deflection winding. Such regenerative switches are advantageous by comparison with transistors because only a pulse is necessary to trigger conduction, whereas a transistor requires base drive for so long as it is to conduct. Because of the mutually opposite direction of conduction of the SCR's, the cathode of only one SCR can be coupled to reference potential, and the cathode of the other must be at a potential other than the reference potential. A conventional SCR is controlled between the gate and cathode terminals. Consequently, only one of the two SCRs controlling the vertical deflection current can have its gate driven by the control circuit with respect to ground. The other SCR has its gate and cathode electrodes floating at some potential other than the reference potential.

As described in the aforementioned Haferl patent, one of the SCR switches has its gate driven with respect to ground, while the other has its gate driven with respect to the cathode, with both voltages floating at the variable voltage across the deflection winding. Generally speaking, this requires that the control circuit be provided with an operating voltage exceeding the maximum voltage across the deflection winding solely for the purpose of allowing a direct coupling between the control circuit and the gate of the controlled SCR's. This high voltage is disadvantageous in that it undesirably increases the total power dissipation of the control circuit, and also in that it requires components capable of withstanding the greater voltage stress.

An arrangement eliminating the voltage stress on the control circuit of an SSVD system is shown in U.S. Pat. No. 4,096,415 issued June 20, 1978 in the name of P. Haferl. In this arrangement, a transformer is interposed between the control circuit and the gate-cathode path of one of the controlled SCR switches. The other SCR in this arrangement is directly coupled to the modulator of the control circuit and the gate is driven relative to ground. The pulse transformer is disadvantageous in that it is bulky, expensive, and may introduce unwanted phase shifts which perturb the stability of the system.

It is desirable to drive the control elements of the electronic switches of the SSVD circuit directly from the control circuit relative to ground.

SUMMARY OF THE INVENTION

An SSVD circuit includes first and second sources of horizontal-frequency signals having first and second mutually opposite polarities and also includes a capacitor. First and second controllable thyristors are coupled to the first and second sources, respectively, and to the capacitor for providing paths for the charging of the capacitor with currents of first and second polarities under the control of the first and second thyristors, respectively. A vertical deflection winding is coupled with the capacitor and it draws deflection current therefrom. A control circuit is coupled to the first and second thyristors for gating the thyristors for charging and discharging the capacitor in a manner for controlling the vertical deflection current. One of the thyristors is a triac.

DESCRIPTION OF THE INVENTION

Figure 1:
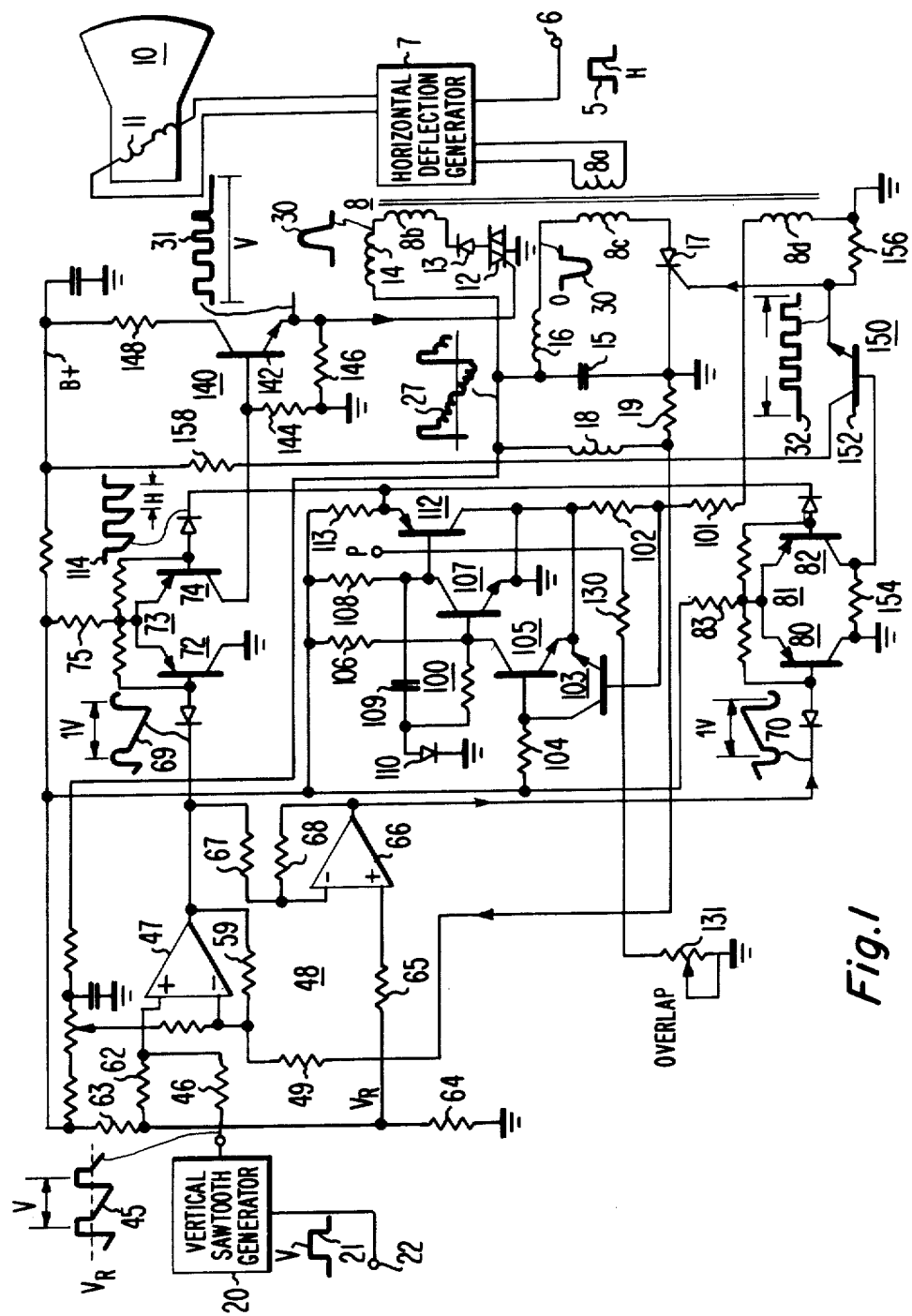
FIG. 1 illustrates in block and schematic diagram form an SSVD arrangement embodying the invention, together with certain amplitude-time voltage waveforms associated with the operation.

FIG. 1 shows a switched mode vertical deflection circuit which may be incorporated in a television receiver. Horizontal sync pulses 5 from a sync separator, not shown, are coupled to an input terminal 6 of a horizontal deflection generator 7. Horizontal deflection generator 7 may be any suitable type for supplying horizontal deflection current to a horizontal deflection winding 11 mounted adjacent to a cathode ray tube 10 as well as supplying horizontal rate pulses for various functions within a television receiver. A primary winding 8a of a horizontal output transformer 8 receives energy from generator 7.

Secondary windings 8b and 8c of transformer 8 produce horizontal-rate energy in the form of recurrent pulses illustrated as 30. The end of the winding 8b at which positive-polarity retrace pulses are produced in connected through an inductor 14 to one end of an integrating capacitor 15. The other end of capacitor 15 is grounded. The end of winding 8b remote from inductor 14 is coupled by way of the cathode-anode path of a diode or rectifier 13 and the main current conducting path of a gate-controllable full-wave AC silicon switch thyristor or triac 12 to ground. Triac 12 controls conduction in the path including winding 8b and inductor 14 by which capacitor 15 can be charged to a positive voltage with respect to ground.

The end of winding 8c at which negative-going horizontal retrace pulses are produced is connected to one end of an inductor 16. The other end of inductor 16 is connected to the junction of inductor 14 and capacitor 15. The end of winding 8c remote from inductor 16 is coupled by way of the anode-cathode path of an SCR 17 to ground. SCR 17 controls conduction in a path including winding 8c and inductor 16 by which capacitor 15 can be charged negative with respect to ground. The serial combination of a deflection winding 18 and current sensing resistor 19 is coupled across capacitor 15 for drawing deflection current therefrom in response to the voltage appearing across capacitor 15 resulting from integration of horizontal-rate energy in the two charging paths. The remainder of the circuitry illustrated in FIG. 1 represents a control circuit by which the gates of thyristors 12 and 17 are driven with pulse-time modulated signals for control of the charging and discharging of capacitor 15 in order to establish the proper deflection current through deflection winding 18. The control circuit illustrated in FIG. 1 is similar to that described in the aforementioned Haferl U.S. Pat. No. 4,048,544, and is also similar to the control circuit described in U.S. Pat. No. 4,081,721 issued Mar. 28, 1978 to P. Haferl. While the operation of such a control circuit is described in the mentioned patents, a summary of the control circuit operation follows.

At the upper left of FIG. 1, vertical deflection rate synchronizing pulses represented by pulse 21 and derived from the synchronizing signal separator (not shown) are coupled to an input terminal 22 of vertical sawtooth generator 20. Vertical sawtooth generator 20 produces, at its output, a recurrent vertical rate sawtooth voltage illustrated as waveform 45 in synchronism with vertical synchronizing pulses 21.

The vertical frequency sawtooth voltage from the output of vertical sawtooth generator 20 is applied by way of a resistor 46 to the noninverting input of an amplifier 47. Also applied to the noninverting input of amplifier 47 by way of a resistor 62 is a direct reference voltage $V_R$ obtained from a voltage divider consisting of resistors 63 and 64 connected from the operating supply voltage B+ to ground. The gain of amplifier 47 is established by negative feedback from the output of the amplifier to its inverting input by way of a resistor 59.

The output of amplifier 47 is coupled to the inverting input of an inverting amplifier 66 by way of resistor 67. The gain of amplifier 66 is maintained at unity by means of a degenerative feedback resistor 68 coupled from the output of amplifier 66 to the inverting input. Reference voltage $V_R$ is also applied to the noninverting input of amplifier 66 by way of a resistor 65. Inverting amplifier 66 together with amplifier 47 constitutes a phase splitting driver amplifier 48 for the power controlling stages of the switched mode vertical deflection system.

The output of amplifier 47 is applied to a first input of a top-of-scan pulse width modulator 73. The output of inverting amplifier 66 is applied to a first input of a bottom-of-scan pulse width modulator 81.

A ramp-on-pulse generator designated generally as 100 may be found near the center of FIG. 1. The detailed operation of generator 100 is described in the aforementioned Haferl U.S. Pat. No. 4,081,721. Generally speaking, generator 100 receives timing information in the form generator 100 receives timing information in the form of horizontal-rate pulses from a winding 8d associated with transformer 8 and produces during the horizontal retrace intervals a ramp voltage superimposed on a pulse, the amplitude of which pulse is variable under the control of resistor 131. The ramp-on-pulse signals produced by generator 100 are illustrated as signal 114 in FIG. 1. The ramp-on-pulse signal is applied to the base of transistors 74 and 82 to provide a reference for control of the gating time of thyristors 12 and 17. Pulse width modulators 73 and 81 have second inputs to which horizontal-rate pulses are applied and generate control switch gating pulses in the form of current pulses at the collectors of transistors 74 and 82, respectively. The collector of transistor 74 is coupled to ground by way of a resistor 144. The collector of transistor 82 is coupled to ground by way of a resistor 154. The current pulses produced at the collectors of transistors 74 and 82 produce time-modulated voltage pulses. The time modulated voltage pulses are applied from modulators 73 and 81 to a pair of emitter followers 140 and 150, respectively. Emitter follower 140 includes an NPN transistor 142 having its emitter coupled to ground by a resistor 146 and its collector coupled to B+ by a resistor 148. Emitter follower 150 includes an NPN transistor 152 having its emitter coupled to ground by a resistor 156 and its collector coupled to B+ by a resistor 158. The time-modulated gating pulses applied to emitter followers 140 and 150 produce at the emitters of transistors 142 and 152 thyristor gating pulses illustrated as 31 and 32, respectively, relative to ground. Pulse trains 31 and 32 as illustrated are simplified. Pulse trains 31 and 32 include width-modulated pulses, the leading edges of which occur at times during the horizontal retrace pulse intervals which are varied to control gating of thyristors 12 and 17 to control the energy coupled to capacitor 15 and deflection winding 18 and the lagging edges of which coincide with the end of horizontal retrace. Voltage pulse train 31 is coupled to the gate of triac 12 from the emitter of transistor 142, and pulse train 32 is coupled to the gate of SCR 17 from the emitter of transistor 152.

In operation during each horizontal retrace interval, secondary windings 8b and 8c each produce a voltage in their capacitor charging paths tending to charge capacitor 15 with opposite-polarity currents. The full magnitude of this voltage initially appears across the open-circuited thyristor. At some time during the retrace interval, one or both thyristors are gated into conduction by a gating pulse of pulse train 31 or 32 and the impedance of the gated thyristor decreases abruptly. In the branch or branches of the charging path of capacitor 15 in which a thyristor is conductive during the horizontal retrace interval, current begins to flow through an inductor to charge capacitor 15. For example, if triac 12 becomes conductive, current will flow in a circular path through winding 8b, inductor 14, capacitor 15 and back to winding 8b through triac 12 and diode 13.

When gated into conduction, control by the gate of the conduction of a thyristor ends. Thus, turn-off of the thyristor cannot occur until current stops flowing through the thyristor. In the arrangement of FIG. 1, current continues to increase through the conductive thyristor during the horizontal retrace interval. During this period of increasing conduction, energy is being stored in the magnetic field associated with series inductor 14 or 16.

As mentioned, the gating pulses of trains 31 and 32 end when the horizontal retrace interval ends. The horizontal trace interval follows the retrace interval. During the trace interval, the voltage produced across winding 8b and 8c by operation of the horizontal deflection circuit assumes a reversed polarity from that existing during the retrace interval. Current continues to flow in the capacitor charging path after the end of the horizontal retrace interval, as the energy stored in the inductor during the retrace interval is transferred to capacitor 15. This current flow maintains the thyristor in conduction, whether it be SCR 17 or triac 12. When the current in SCR 17 reaches zero, the SCR opens or becomes nonconductive until the next following gating interval.

Triacs such as 12 as commercially available have turn-on times compatible with operation during the horizontal retrace interval. However, the turn-off time is relatively long. While triac 12 alone provides the advantages of the invention, it may be advantageous to use diode 13 with commercially available traics. During the turn-off interval of triac 12, which occurs during the horizontal trace interval immediately following a horizontal retrace interval, the change in voltage across the triac may occur more quickly than the triac can follow. Consequently, in the absence of diode 13, triac 12 may not turn off at the time the current in the charging path including capacitor 15, inductor 14 and winding 8b decreases to zero. Instead, thyristor 12 may continue to conduct, and the conduction would be in a polarity opposite to that occurring during the retrace interval, which might perturb the operation of the SSVD system. With diode 13 present, no current flows in the path including capacitor 15, inductor 14, winding 8b and thyristor 12 after the current in the capacitor charging path decreases to zero, even though thyristor 12 continues to be conductive for a portion of the remaining horizontal trace interval.

It will be noted that a charging path for capacitor 15 includes thyristor 12, diode 13, winding 8b and inductor 14 in a series connection. In such a series connection, the same current flows through each of the elements and their positions may be interchanged at will.

Figure 2:
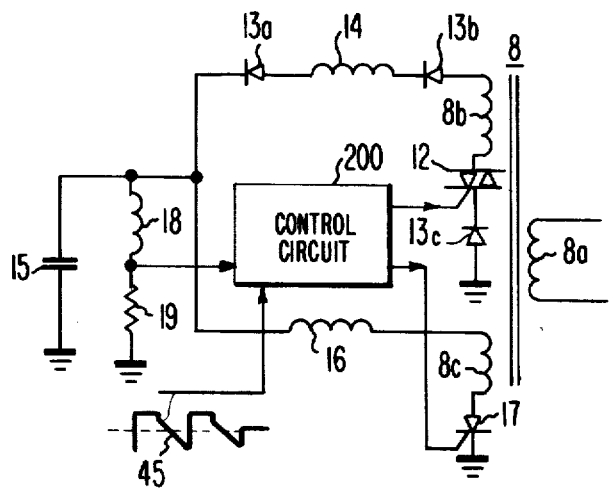
FIGS. 2 and 3 illustrate in block and schematic diagram form alternate embodiments of the invention.

FIG. 2 illustrates other embodiments of the invention. In FIG. 2, elements common with those of FIG. 1 are designated by the same reference number. The entire control circuit illustrated in schematic detail in FIG. 1 is represented in FIG. 2 as a block 200. The charging path for capacitor 15 in FIG. 2 includes inductor 14, winding 8b and thyristor 12. Two possible alternate locations for diode 13 are illustrated by diodes 13a and 13b. Another location for diode 13 is shown by diode 13c, so long as gate drive for triac 12 is negative, and the additional semiconductor junction offset voltage from ground is acceptable.

Figure 3:
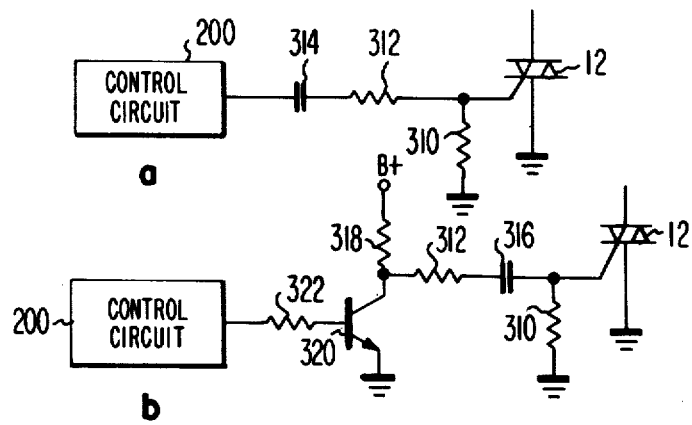

FIG. 3 illustrates arrangements by which the control circuit may be capacitively coupled to the gate of the triac. FIG. 3a illustrates an arrangement for driving the gate of triac 12 with positive pulses, and FIG. 3b an arrangement for driving the gate with negative pulses relative to ground.

In FIG. 3a, pulses 31 are coupled from control circuit 200 through a capacitor 314 to a voltage divider including resistors 310 and 312. The gate of thyristor 12 is connected to the tap of the voltage divider. In FIG. 3b, pulses such as 31 are coupled through a resistor 322 to an inverting amplifier including an NPN transistor 320. The emitter of transistor 320 is connected to ground and the collector is coupled to B+ by means of a resistor 318. Inverted pulses appear at the collector of transistor 320 and are coupled to the gate of thyristor 12 by the serial combination of a resistor 312 and capacitor 316. A resistor 310 is coupled between the gate of thyristor 12 and ground.

The invention provides simplified drive for an SSVD circuit, since continuous base drive need not be supplied to the thyristors, and both thyristors may be gated relative to a common reference potential. The common gating reduces unwanted coupling of signals from the power circuits to the control circuits, which coupling may result in black lines or streaks in the raster.

Other embodiments of the invention will be apparent to those skilled in the art. For example, the triac may be driven with current of either polarity, and the diode may be integrated with the triac into a single package or onto a single substrate. The thyristors may as known be gated into conduction during either the trace or retrace intervals.

What is claimed is:

1. A switched vertical deflection circuit, comprising:
a capacitor;
a first charging circuit coupled across said capacitor for charging said capacitor with current of a first polarity, said first charging circuit including a source of horizontal-rate signals and an electronic switch, one electrode of said electronic switch being coupled to a point of reference potential;
a second charging circuit coupled across said capacitor for charging said capacitor with a second current of polarity opposite to said first, said second charging circuit including the serial combination of a source of horizontal-rate signals, a diode and the main current conduction path of a triac, one electrode of said triac being coupled to said point of reference potential;
a deflection winding coupled with said capacitor for drawing deflection current therefrom; and
control means coupled with said electronic switch and with said triac for controlling the conduction of said electronic switch and said triac to control said deflection current.

2. A circuit according to claim 1, wherein said control circuit is coupled to said point of reference potential, to the control electrode of said electronic switch and to the gate electrode of said triac.

3. A circuit according to claim 2 wherein said electronic switch is an SCR.

4. A circuit according to claim 2 wherein said first and second charging circuits each include inductance means.

5. An improved SSVD circuit, comprising:
a first source of horizontal-frequency signals of a first polarity;
a second source of horizontal frequency signals of a second polarity relative to said first;
a capacitor;
first and second controllable electronic switches coupled to said first and second sources, respectively, and to said capacitor for providing paths for charging said capacitor with first and second polarities under the control of said first and second electronic switches, respectively;
a vertical deflection winding coupled with said capacitor for drawing deflection current therefrom;
control means coupled with said first and second electronic switches for gating said switches for charging and discharging said capacitor for controlling said deflection current;
wherein the improvement lies in that said second electronic switch is a regenerative, bidirectionally conductive thyristor, a main terminal electrode of said thyristor being coupled to a point of reference potential.

6. An SSVD circuit comprising:
a vertical deflection winding;
a capacitor coupled to said vertical deflection winding;

a first charging circuit coupled across said capacitor for charging said capacitor with current of a first polarity, said first charging circuit including a source of horizontal-rate signals and a first regenerative electronic switch, one main terminal electrode of said electrode switch being coupled to a point of reference potential;

a second charging circuit coupled across said capacitor for charging said capacitor with current of a polarity opposite to said first, said second charging circuit including a second source of horizontal-rate signals, said second source producing voltage of a polarity for promoting current of said second polarity during a first interval of each cycle of said horizontal-rate signals and producing voltage of a polarity opposite of said first during a second interval of each cycle, said second charging circuit also including a second, bidirectionally conductive, regenerative electronic switch serially coupled in said charging path, with a main terminal electrode of said second switch being coupled to said point of reference potential;

a control circuit responsive to a vertical rate signal and conductively coupled to the gate electrodes of said first and second regenerative switches for applying gating voltages to said gate electrodes at varied instants within each cycle of said horizontal-rate signals to turn on said first and second regenerative switches, the conduction of said first and second regenerative switches enabling said first and second charging circuits to charge said capacitor so as to generate a vertical deflection current in said vertical deflection winding, said second bidirectionally conductive regenerative switch being gated into conduction during said first interval and remaining conductive as a result of regeneration until the current therethrough reverses direction during the beginning portion of said second interval, the turn-off characteristic of said second, bidirectionally conductive, regenerative switch such that the change in voltage capable of being applied to said second switch by said second charging circuit as the current therethrough reverses direction can enable said second switch to conduct in the reverse direction during the remaining portion of said second interval; and a diode serially coupled with said second switch for preventing reverse conduction in said second switch during said remaining portion of said second interval.

7. A circuit according to claim 5 wherein said first electronic switch comprises a thyristor with a main terminal electrode being coupled to said point of reference potential, said control means applying the same polarity turn-on gating voltages to both said first and second electronic switches.

8. A circuit according to claim 5 wherein said bidirectionally conductive thyristor charges said capacitor to the same polarity voltage with respect to said point of reference potential as the polarity of the gating turn-on voltage applied to the thyristor.

* * * * *

UNITED STATES PATENT AND TRADEMARK OFFICE
CERTIFICATE OF CORRECTION

PATENT NO. : 4,238,712
DATED : Dec. 9, 1980
INVENTOR(S) : Wolfgang F. W. Dietz

It is certified that error appears in the above-identified patent and that said Letters Patent is hereby corrected as shown below:

Col. 2, line 50, "in" should read -- is --.

Col. 3, line 58, delete "generator 100 receives timing information in the form". Col. 7, line 6, "electrode" should read -- electronic --; line 17, "of" should read -- to --.

Signed and Sealed this

Fourteenth Day of April 1981

[SEAL]

Attest:

RENE D. TEGTMEYER

Attesting Officer

Acting Commissioner of Patents and Trademarks